US009997437B2

(12) United States Patent
Ikeda (10) Patent No.: US 9,997,437 B2
(45) Date of Patent: Jun. 12, 2018

(54) POWER SEMICONDUCTOR MODULE FOR IMPROVED THERMAL PERFORMANCE

(71) Applicant: SHINDENGEN ELECTRIC MANUFACTURING CO., LTD., Tokyo (JP)

(72) Inventor: Kosuke Ikeda, Hanno (JP)

(73) Assignee: Shindengen Electric Manufacturing Co., Ltd., Tokyo (JP)

(*) Notice: Subject to any disclaimer, the term of this patent is extended or adjusted under 35 U.S.C. 154(b) by 69 days.

(21) Appl. No.: 14/902,548

(22) PCT Filed: Apr. 28, 2015

(86) PCT No.: PCT/JP2015/002285
§ 371 (c)(1),
(2) Date: Dec. 31, 2015

(87) PCT Pub. No.: WO2016/174698
PCT Pub. Date: Nov. 3, 2016

(65) Prior Publication Data
US 2017/0092568 A1    Mar. 30, 2017

(51) Int. Cl.
H01L 23/495    (2006.01)
H01L 23/31     (2006.01)
H01L 23/367    (2006.01)

(52) U.S. Cl.
CPC .... H01L 23/49537 (2013.01); H01L 23/3142 (2013.01); H01L 23/3675 (2013.01); H01L 23/49562 (2013.01); H01L 23/49568 (2013.01)

(58) Field of Classification Search
CPC ................................................ H01L 23/49537
(Continued)

(56) References Cited

U.S. PATENT DOCUMENTS 6,084,771 A * 7/2000 Ranchy .............. H05K 7/20927
165/185
6,201,701 B1 * 3/2001 Linden ................. H05K 1/0206
174/252
(Continued)

FOREIGN PATENT DOCUMENTS

JP   11-067999 A   3/1999
JP   2006-040926 A   2/2006
(Continued)

OTHER PUBLICATIONS

ISR for PCT/JP2015/002285 dated Jul. 21, 2015.
(Continued)

*Primary Examiner* — Ajay K Arora
(74) *Attorney, Agent, or Firm* — Ladas & Parry, LLP (57) ABSTRACT

Semiconductor module has a first member, a second member, a conductor column extending in the vertical direction between the first member and the second member and a sealing resin covering a first conductor layer and a first power device of the first member, a second conductor layer and a second power device of the second member and the conductor column. Positions of the first power device and the second power device on the horizontal plane are shifted, the second conductor layer is not provided in the vertical direction from a first connection part connected to the first power device, and the first conductor layer is not provided in the vertical direction from a second connection part, connected to the second power device, of the second power device.

9 Claims, 12 Drawing Sheets

(58) Field of Classification Search
USPC .......................................................... 257/668
See application file for complete search history.

(56) References Cited

U.S. PATENT DOCUMENTS

| 6,356,448 | B1 * | 3/2002 | DiBene, II | G06F 1/18 |
| | | | | 174/252 |
| 2007/0108575 | A1 * | 5/2007 | Montgomery | H01L 23/13 |
| | | | | 257/678 |
| 2007/0284720 | A1 * | 12/2007 | Otremba | H01L 23/49524 |
| | | | | 257/690 |
| 2008/0116590 | A1 | 5/2008 | Matsuoka | |
| 2011/0081750 | A1 | 4/2011 | Machida | |
| 2015/0189756 | A1 | 7/2015 | Ikeda | |

FOREIGN PATENT DOCUMENTS

| JP | 2008-130750 A | 6/2008 |
| JP | 2009-538534 A | 11/2009 |
| JP | 2011-114176 A | 6/2011 |
| JP | 2014-045157 A | 3/2014 |
| WO | 2007/139852 A2 | 12/2007 |
| WO | 2014-132397 | 9/2014 |

OTHER PUBLICATIONS

English Translation of PCT search report from PCT/JP2015/002285 dated Jul. 21, 2015.
Written Opinion for PCT/JP2015/002285 dated Jul. 21, 2015 with machine English translation.
Written Opinion for PCT/JP2015/002285 dated Jul. 21, 2015 with English translation from WIPO (dated Jul. 21, 2016).
International Preliminary Report on Patentability (IPRP; CH 1) for PCT/JP2015/002285 dated Nov. 9, 2017 with English translation from WIPO.
From EPO Application No. 15819776.4, Supplementary European Search Report and Search Opinion dated Nov. 6, 2017.

* cited by examiner

Prior Art

POWER SEMICONDUCTOR MODULE FOR IMPROVED THERMAL PERFORMANCE

CROSS-REFERENCE TO RELATED APPLICATIONS

This application is the U.S. National Stage of International Patent Application No. PCT/JP2015/002285 filed on Apr. 28, 2015, the disclosure of which is incorporated herein by reference.

TECHNICAL FIELD

The present invention relates to a semiconductor module.

BACKGROUND ART

Conventionally, semiconductor modules employing a structure where devices are stacked are known. One example of such a conventional semiconductor module may be International Publication No. 2014-132397. This International Publication No. 2014-132397 discloses that heat generation by a semiconductor module is prevented by disposing a switching element generally generating more heat and a rectifying element generally generating less heat in an opposing manner.

Figure 8:
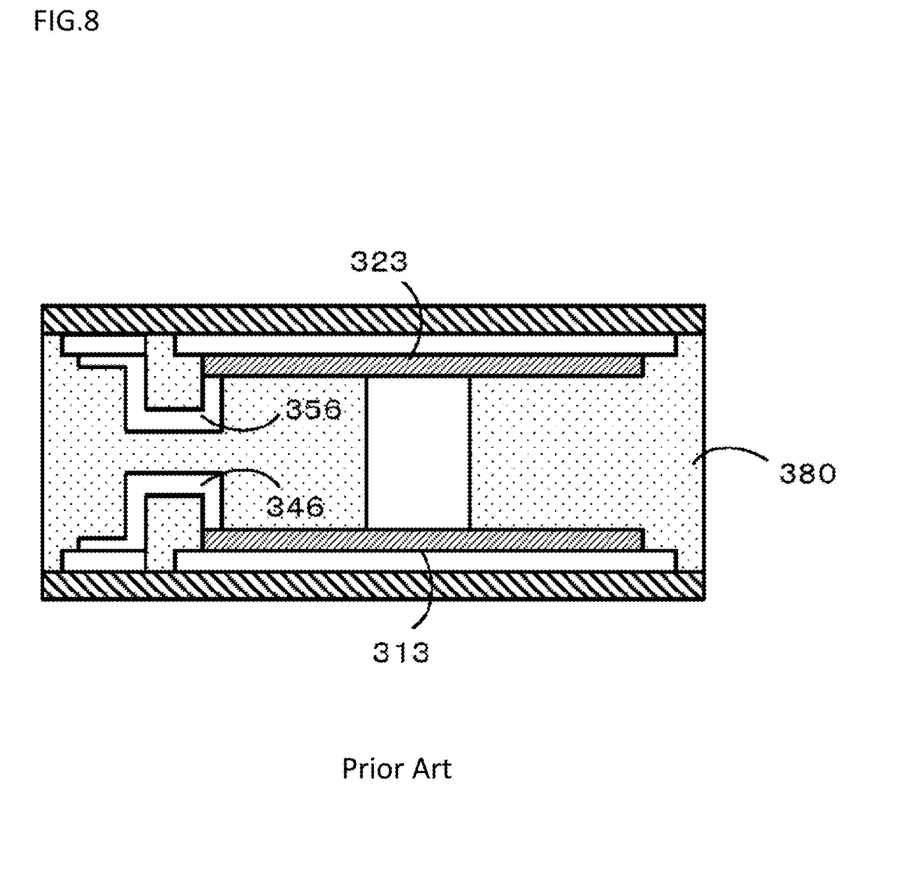
FIG. 8 illustrates a front cross-sectional view of a semiconductor module illustrating an arrangement where devices with a high calorific value are simply laminated.

Contrary to this, recently, there has been an effort to stack devices with a high calorific value. In this manner, simply laminating devices 313 and 323 as illustrated in FIG. 8 when stacking the devices 313 and 323 with a high calorific value results in duplication of heat from two of the devices 313 and 323 with a high calorific value, thereby causing the semiconductor module to generate heat. Also, when connection parts 346 and 356 for connecting conductor layers 312 and 322 and the devices 313 and 323 are disposed opposite to each other as illustrated in FIG. 8, the thickness of the semiconductor module disadvantageously increases. If the thickness of the semiconductor module disadvantageously increases in this manner, the amount of sealing resin 380 increases, thereby promoting accumulation of heat. This can be a serious problem with an arrangement where devices with a high calorific value are stacked.

SUMMARY OF INVENTION

Technical Problem

The present invention has been devised in consideration of such points and provides a semiconductor module that implements a high heat radiation performance while a size thereof in the vertical direction (thickness direction) is downsized.

Solution to Problem

Semiconductor module comprises:
a first member having a first insulating substrate, a first conductor layer provided on a mounting surface of the first insulating substrate, a first power device provided to the first conductor layer and a first connection part connected the first power device;
a second member having a second insulating substrate, a second conductor layer provided on a mounting surface of the second insulating substrate, a second power device provided to the second conductor layer and a second connection part connected the second power device;
a conductor column extending in the vertical direction between the first member and the second member; and
a sealing resin covering the first conductor layer, the first power device, the second conductor layer, the second power device and the conductor column;
wherein the first power device and the second power device are disposed opposite to each other and connected to each other via the conductor column,
wherein positions of the first power device and the second power device on the horizontal plane are shifted,
wherein the second conductor layer is not provided in the vertical direction from the first connection part and
wherein the first conductor layer is not provided in the vertical direction from the second connection part.

In the semiconductor according to the present invention, wherein the first power device has a first high heating surface and a first low heating surface which is the opposite surface of the first high heating surface and has a smaller calorific value than that of the first high heating surface,
wherein the second power device has a second high heating surface and a second low heating surface which is the opposite surface of the second high heating surface and has a smaller calorific value than that of the second high heating surface, and
wherein the first high heating surface and the second high heating surface are disposed opposite to each other and connected via the conductor column.

In the semiconductor according to the present invention, wherein the first power device and the second power device are switching devices, and
wherein a side surface of the conductor column is provided with a column connection part connected to a source electrode.

In the semiconductor according to the present invention, wherein the first power device and the second power device are switching devices, and
wherein the first connection part and the second connection part are connected to control electrodes.

In the semiconductor according to the present invention, wherein a direction, on the horizontal plane, in which the first connection part extends from a connecting portion of the first power device and the first connection part, and a direction, on the horizontal plane, in which the second connection part extends from a connecting portion of the second power device and the second connection part are arranged with an angular difference of 135 to 180 degrees.

In the semiconductor according to the present invention, wherein the first power device is shifted, from the conductor column, toward the first connection part on the horizontal plane, and the second power device is shifted, from the conductor column, toward the second connection part on the horizontal plane.

The semiconductor according to the present invention, further comprises a plurality of lead frames,
wherein each of the lead frames protrudes to the outside from one side of the sealing resin, and
wherein the first power device and the second power device are shifted in a direction parallel to the side.

Electronic device according to the present invention comprises:
the aforementioned semiconductor module, and
a heat sink provided with a recessed part for receiving the semiconductor module.

In the electronic device according to the present invention,
wherein a lubricant is applied between the recessed part of the heat sink and the semiconductor module.

The electronic device according to the present invention may further comprise a sealing part covering the semiconductor module inserted in the recessed part of the heat sink.

Effects of Invention

In the present invention, the first power device and the second power device are shifted on the horizontal plane while the second conductor layer is not provided in the vertical direction seen from the first connection part and the first conductor layer is not provided in the vertical direction seen from the second connection part. This allows for downsizing the semiconductor module in the vertical direction (thickness direction). As a result, the amount of the sealing resin can be reduced. Moreover, the shift of the first power device and the second power device on the horizontal plane allows for preventing accumulation of the heat generated from each of the first power device and the second power device as much as possible. In this manner, even in an arrangement where the first power device and the second power device each having a high calorific value are disposed opposite to each other, accumulation of heat in the semiconductor module can be prevented as much as possible.

DESCRIPTION OF EMBODIMENTS

First Embodiment

<<Configuration>>

A first embodiment of a semiconductor module according to the invention will be described below with reference to the drawings.

Figure 1:
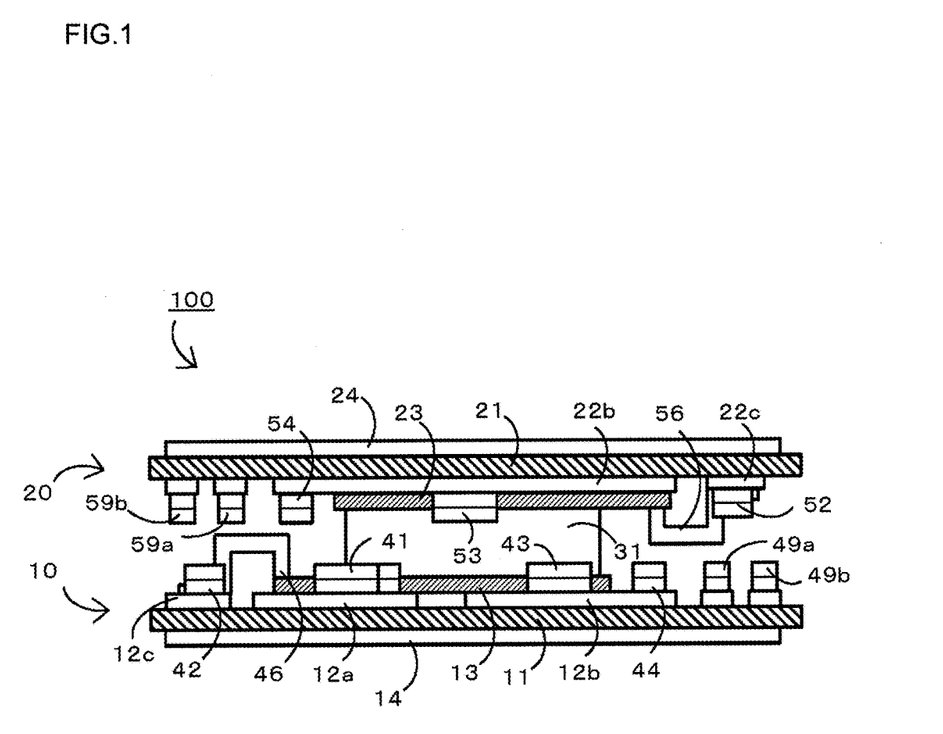
FIG. 1 illustrates a front cross-sectional view of a semiconductor module according to a first embodiment of the invention.

As illustrated in FIG. 1, a semiconductor module 100 according to the present embodiment has a first member 10, a second member 20, and a conductor column 31 extending in the vertical direction between the first member 10 and the second member 20. In the embodiment, a first insulating substrate 11 of the first member 10 and a second insulating substrate 21 of the second member 20 are disposed in parallel. In the embodiment, a surface where the first insulating substrate 11 and the second insulating substrate 21 extends (a surface extending in the horizontal direction in FIG. 1) is referred to as the horizontal plane while a direction orthogonal to this horizontal plane (that is, the vertical direction in FIG. 1) is referred to as the vertical direction.

Figure 2:
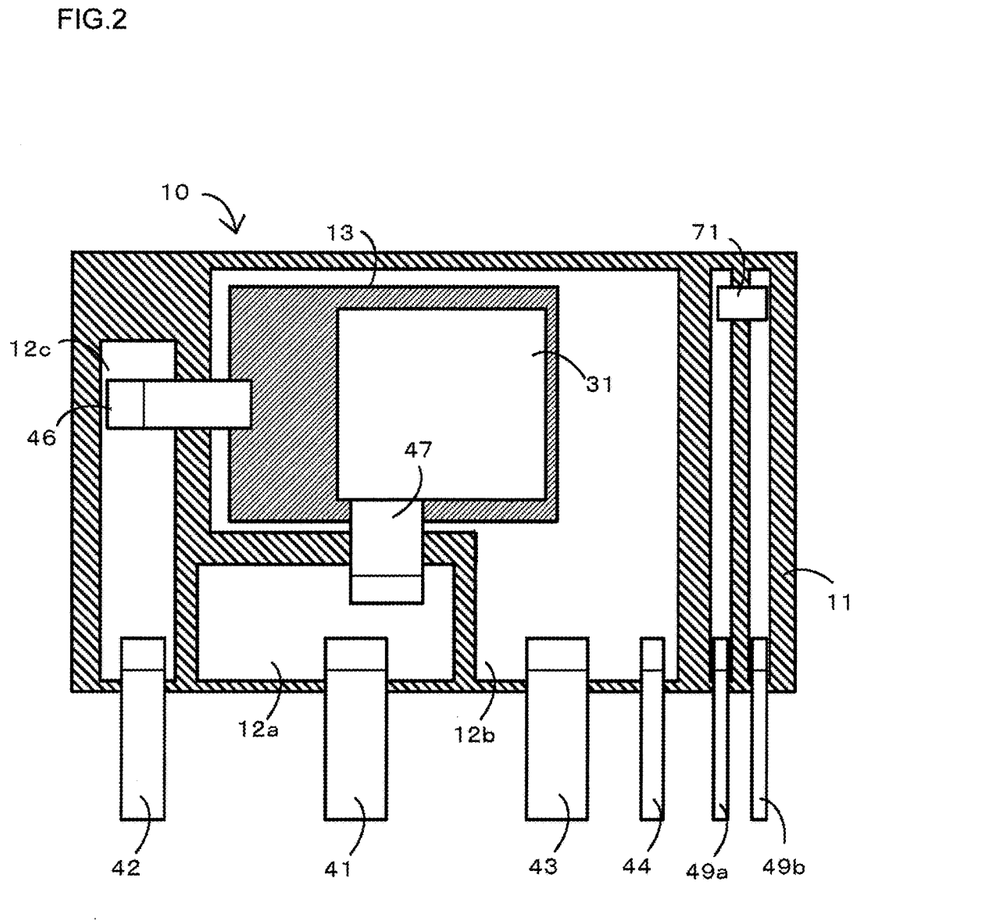
FIG. 2 illustrates a plan view of a first member and a conductor column used in the first embodiment of the invention.

As illustrated in FIG. 2, the first member 10 has the first insulating substrate 11, a first conductor layer 12 (12a to 12c) provided on a mounting surface of the first insulating substrate 11, a first power device 13 provided to a first conductor layer part 12b (to be described later) of the first conductor layer 12, and a first connection part 46 connected the first power device 13. In the embodiment, the first connection part 46 is connected to the first power device 13 in FIG. 2 substantially in the center of the left side of a top surface thereof.

Figure 3:
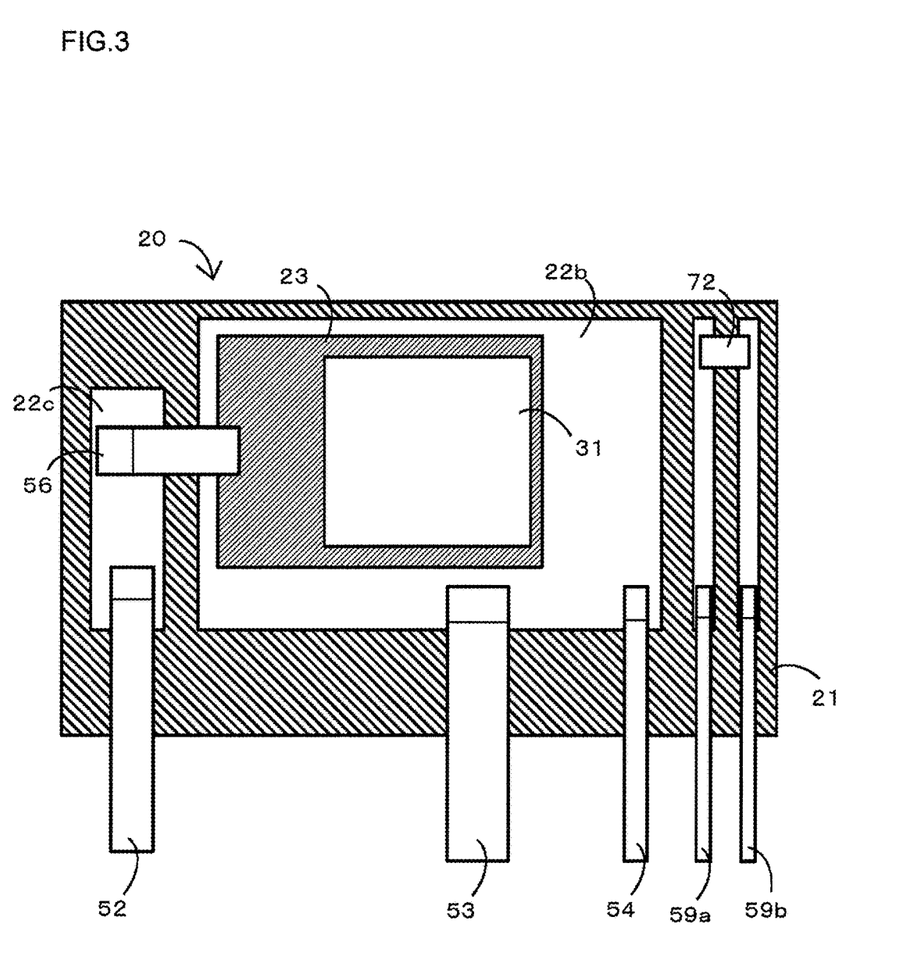
FIG. 3 illustrates a plan view of a second member and a conductor column used in the first embodiment of the invention.

As illustrated in FIG. 3, the second member 20 has the second insulating substrate 21, a second conductor layer 22 (22b and 22c) provided on a mounting surface of the second insulating substrate 21, a second power device 23 provided to a second conductor layer part 22b (to be described later) of the second conductor layer 22, and a second connection part 56 connected the second power device 23. In the embodiment, the second connection part 56 is connected to the second power device 23 in FIG. 3 substantially in the center of the left side of a top surface thereof.

Note that, in the embodiment, the second member 20 is turned over and placed over the first member 10. Therefore, in an arrangement in FIG. 1, the first connection part 46 is connected to the first power device 13 at the left side of the top surface thereof while the second connection part 56 is connected to the second power device 23 at the right side of the lower surface thereof.

One example of a power device may be a switching device. More specifically, one example of the power device may be a FET such as a MOSFET, bipolar transistor, IGBT, or the like while a typical example may be a MOSFET.

Figure 5:
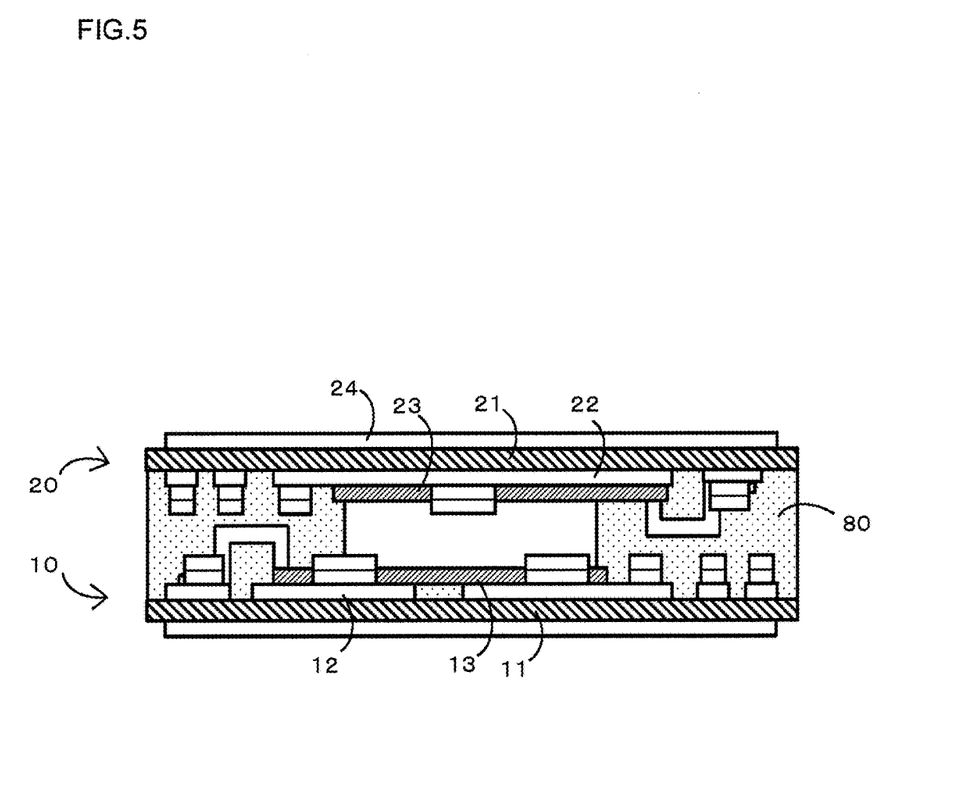
FIG. 5 illustrates a front cross-sectional view of the semiconductor module according to the first embodiment of the invention with sealing resin further illustrated.

As illustrated in FIG. 5, the semiconductor module 100 according to the present embodiment further includes a sealing resin 80 covering the first conductor layer 12, the first power device 13, the second conductor layer 22, the second power device 23, and the conductor column 31.

As illustrated in FIG. 2, the first conductor layer 12 includes a plurality of first conductor layer parts 12a to 12c provided on the mounting surface of the first insulating substrate 11. As illustrated in FIG. 3, the second conductor layer 22 includes a plurality of second conductor layer parts 22b and 22c provided on the mounting surface of the second insulating substrate 21.

Figure 4:
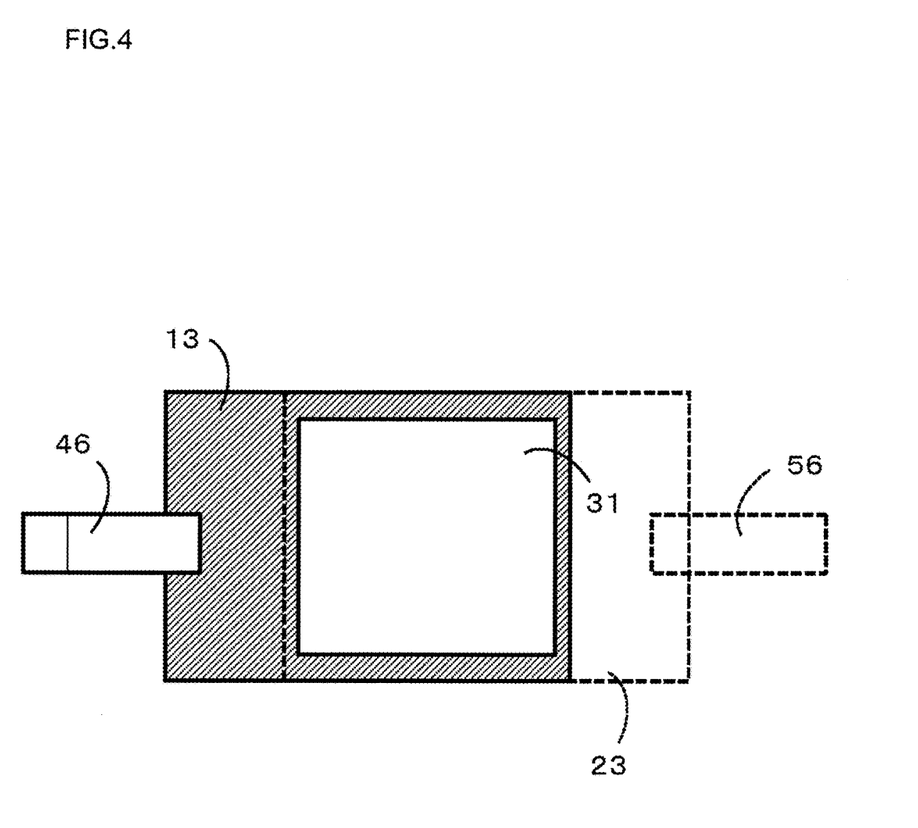
FIG. 4 illustrates a plan view for describing shift of a first power device and a second power device on a horizontal plane and a relation between a first connection part and a second connection part according to the first embodiment of the invention.

As illustrated in FIG. 1, in the embodiment, the first power device 13 and the second power device 23 are disposed opposite to each other and connected to each other via the conductor column 31. Moreover, as illustrated in FIG. 4, positions of the first power device 13 and the second power device 23 on the horizontal plane are shifted. Furthermore, the second conductor layer 22 is not provided in the vertical direction from the first connection part 46 and, similarly, the first conductor layer 12 is not provided in the vertical direction from the second connection part 56.

The first power device 13 is shifted, from the conductor column 31, toward the first connection part 46 (toward left in FIG. 4) on the horizontal plane. Meanwhile, the second power device 23 is shifted, from the conductor column 31, toward the second connection part 56 (toward right in FIG. 4) on the horizontal plane. Note that a cross section of the conductor column 31 of the embodiment is substantially rectangular-shaped.

The first power device 13 has a first high heating surface and a first low heating surface which is the opposite surface of the first high heating surface and has a smaller calorific value than that of the first high heating surface. Similarly, the second power device 23 has a second high heating surface and a second low heating surface which is the opposite surface of the second high heating surface and has a smaller calorific value than that of the second high heating surface. Moreover, in the embodiment, the first high heating surface of the first member 10 is facing upward in FIG. 1 while the second high heating surface of the second member 20 is facing downward in FIG. 1. Therefore, the first high heating surface and the second high heating surface are disposed opposite to each other. The first high heating surface and the second high heating surface are connected via the conductor column 31.

Figure 6:
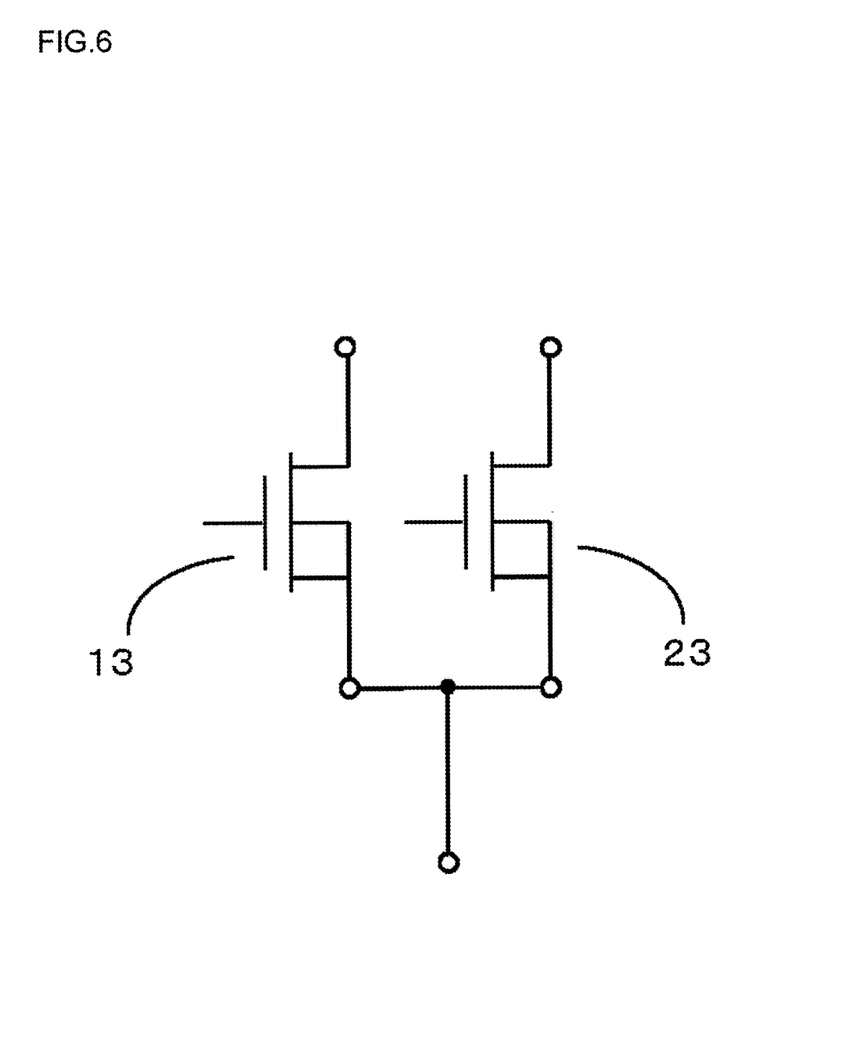
FIG. 6 illustrates a circuit diagram of the semiconductor module according to the first embodiment of the invention.

As illustrated in FIG. 2, a side surface of the conductor column 31 is provided with a column connection part 47 connected to the first conductor layer part 12a. The first conductor layer part 12a is provided with a lead frame 41 for connection to a source electrode. Power supplied from the source electrode is then supplied to the first power device 13 and the second power device 23 via the first conductor layer part 12a, column connection part 47, and conductor column 31 (also refer to FIG. 6). Note that such a supplying manner of power is one of the reasons for the fact that a top surface of the first power device 13 in FIG. 1 and a bottom surface of the second power device 23 in FIG. 1, each connected to the conductor column 31, become the first high heating surface and the second high heating surface, respectively.

The first connection part 46 is substantially U-shaped when seen from the front as illustrated in FIG. 1. The second connection part 56 is also substantially U-shaped when seen from the front as illustrated in FIG. 1. As illustrated in FIG. 2, the first connection part 46 is connected to the first conductor layer part 12c. This first conductor layer part 12c is provided with a lead frame 42 for connection to a control electrode such as a gate electrode. As illustrated in FIG. 3, the second connection part 56 is connected to the second conductor layer part 22c. This second conductor layer part 22c is provided with a lead frame 52 for connection to a control electrode such as a gate electrode.

In FIG. 2, the first conductor layer part 12b provided to a bottom surface of the first power device 13 is connected to a lead frame 43 for connection to a drain electrode. In FIG. 3, the second conductor layer part 22b provided to a bottom surface of the second power device 23 is connected to a lead frame 53 for connection to a drain electrode.

In the embodiment, a first radiation plate 14 including copper, etc. is provided to the opposite side (a bottom surface side in FIG. 1) to the mounting surface of the first insulating substrate 11. A second radiation plate 24 including copper, etc. is provided to the opposite side (a top surface side in FIG. 1) to the mounting surface of the second insulating substrate 21.

As illustrated in FIG. 4, a direction, on the horizontal plane, in which the first connection part 46 extends from a connecting portion of the first power device 13 and the first connection part 46 (hereinafter referred to as "a first connection part extending direction") and a direction, on the horizontal plane, in which the second connection part 56 extends from a connecting portion of the second power device 23 and the second connection part 56 (hereinafter referred to as "a second connection part extending direction") are arranged with an angular difference of 135 to 180 degrees. In an arrangement in FIG. 4, the first connection part extending direction is a leftward direction while the second connection part extending direction is a rightward direction. The first connection part extending direction and the second connection part extending direction are arranged with an angular difference of 180 degrees (a concept of "180 degrees" in the embodiment includes "substantially 180 degrees"). In an arrangement in FIG. 4, the first power device 13 and the second power device 23 are shifted with an angular difference of 180 degrees.

The semiconductor module 100 of the embodiment has a plurality of lead frames including the aforementioned lead frames 42 and 52 for connection to two gate electrodes, the lead frame 41 for connection to one source electrode, the lead frames 43 and 53 for connection to two drain electrodes, and lead frames 44, 49a, 49b, 54, 59a, and 59b, which will be described later. Each of the lead frames protrudes to the outside from one side of the sealing resin 80. Describing with FIGS. 2 and 3, each of the lead frames protrudes downward from a side extending in the horizontal direction in the lower side in FIGS. 2 and 3. Note that the side extending in the horizontal direction in the lower side in FIGS. 2 and 3 are the same as a side extending in the horizontal direction in the lower side in FIG. 4. As illustrated in FIG. 4, the first power device 13 and the second power device 23 are shifted in a direction parallel to the side (namely, the horizontal direction in FIG. 4).

As illustrated in FIG. 2, the semiconductor module 100 has a first heat detection resistance 71 on the side of the first insulating substrate 11. Two lead frames 49a and 49b are connected to the first heat detection resistance 71. The first heat detection resistance 71 is disposed in proximity to the first conductor layer part 12b for connection to a drain electrode and is used for measuring the temperature of the first conductor layer part 12b. Also, as illustrated in FIG. 3, the semiconductor module 100 has a second heat detection resistance 72 on the side of the second insulating substrate 21. Two lead frames 59a and 59b are connected to the second heat detection resistance 72. The second heat detection resistance 72 is disposed in proximity to the second conductor layer part 22b for connection to a drain electrode and is used for measuring the temperature of the second conductor layer part 22b.

As illustrated in FIG. 2, the first conductor layer part 12b for connection to a drain electrode is provided with the lead frame 44 for sensing. As illustrated in FIG. 3, the second conductor layer part 22b for connection to a drain electrode is provided with the lead frame 54 for sensing.

<<Actions and Effects>>

Next, actions and effects of the embodiment having the aforementioned configuration will be described.

When devices having a high calorific value are disposed opposing to each other, in other words when the first power device 13 and the second power device 23 are disposed opposing to each other as in the present embodiment, how to allow the heat generated therefrom to dissipate is important.

In the embodiment, the first power device 13 and the second power device 23 are shifted on the horizontal plane while the second conductor layer 22 is not provided in the vertical direction seen from the first connection part 46 and the first conductor layer 12 is not provided in the vertical direction seen from the second connection part 56. This allows for downsizing the semiconductor module 100 in the vertical direction (thickness direction). As a result, the amount of the sealing resin 80 can be reduced. Moreover, the shift of the first power device 13 and the second power device 23 on the horizontal plane allows for preventing accumulation of the heat generated from each of the first power device 13 and the second power device 23 as much as possible. In this manner, even in an arrangement where the first power device 13 and the second power device 23 each having a high calorific value are disposed opposite to each other, accumulation of heat in the semiconductor module 100 can be prevented as much as possible.

In the embodiment, the first high heating surface and the second high heating surface are disposed opposite to each other. Therefore, the heat generated from each of the first power device 13 and the second power device 23 further accumulates. In this regard, in the embodiment, by downsizing the semiconductor module 100 in the vertical direction (thickness direction) and thereby reducing the amount of the sealing resin 80 as well as shifting the first power device 13 and the second power device 23 on the horizontal plane allow for preventing accumulation of the heat generated from each of the first power device 13 and the second power device 23 as much as possible.

When the first connection part extending direction in which the first connection part 46 extends and the second connection part extending direction in which the second connection part 56 extends are arranged with an angular difference of 135 to 180 degrees (refer to FIG. 4), the size of the semiconductor module 100 can be reduced in one direction on the horizontal plane (the vertical direction in FIG. 4). As a result, the shape of the semiconductor module 100 on the horizontal plane can be closer to a rectangle than a square. This allows for downsizing the semiconductor module 100 in general, which results in prevention of accumulation of heat in the semiconductor module 100 as much as possible. Note that, as illustrated in FIG. 4, when the first connection part extending direction in which the first connection part 46 extends and the second connection part extending direction in which the second connection part 56 extends are arranged with an angular difference of 180 degrees, the semiconductor module 100 can be downsized in a direction, on the horizontal plane, orthogonal to the first connection part extending direction and the second connection part extending direction (the vertical direction in FIG. 4). This can further prevent accumulation of heat in the semiconductor module 100 as much as possible.

From a perspective of reducing the resistance in the conductor column 31 and thereby preventing accumulation of heat in the semiconductor module 100 as much as possible, it is preferable that the cross section of the conductor column 31 is as large as possible. One example is to arrange such that the cross section of the conductor column 31 covers 60% or more of the area(s) of the first power device 13 and/or second power device 23 on the horizontal plane. An upper limit of the cross section of the conductor column 31 may be, for example, 80% of the area(s) of the first power device 13 and/or second power device 23 on the horizontal plane. Keeping the cross section of the conductor column 31 80% or less of the area(s) of the first power device 13 and/or second power device 23 on the horizontal plane allows for avoiding the first power device 13 and the second power device 23 to overlap in 20% or more of the area(s) on the horizontal plane. This allows for avoiding the first power device 13 and/or the second power device 23 to overlap in 20% or more of the area(s).

As illustrated in FIG. 4, in the embodiment, the first connection part 46 is connected to the first power device 13 substantially in the center in the depth direction on the top surface thereof. Also, the second connection part 56 is connected to the second power device 23 substantially in the center in the depth direction on the bottom surface thereof. In this manner, in the embodiment, the first power device 13, first connection part 46, second power device 23, and the second connection part 56 are disposed point-symmetrically with respect to the center point of the conductor column 31. This allows for transferring the heat generated from the first power device 13 and the second power device 23 point-symmetrically with respect to the center point of the conductor column 31, thereby avoiding transferring regions of the heat to overlap as much as possible. Therefore, a radiation efficiency can be improved.

Note that in the arrangements in FIGS. 1 to 5, when seen from a direction in which the lead frames protrude from the sealing resin 80 (seen from the front in FIG. 1), the lead frame 44 for sensing provided to the first conductor layer part 12b and the lead frame 54 for sensing provided to the second conductor layer part 22b are disposed point-symmetrically with respect to the center point of the conductor column 31. Moreover, when seen from the front in FIG. 1, the two lead frames 49a and 49b provided to the first heat detection resistance 71 and the two lead frames 59a and 59b provided to the second heat detection resistance 72 are disposed point-symmetrically with respect to the center point of the conductor column 31. Moreover, when seen from the front in FIG. 1, the lead frame 42 for connection to a control electrode and the lead frame 52 for connection to a control electrode are disposed point-symmetrically with respect to the center point of the conductor column 31. This allows for transferring the heat generated from the first member 10 and the second member 20 point-symmetrically with respect to the center point of the conductor column 31, thereby avoiding transferring regions of the heat to overlap as much as possible.

In the embodiment, each of the lead frames protrudes to the outside from a side of the sealing resin 80 (a side extending in the horizontal direction in the lower side in FIGS. 2 and 3). Shifting the first power device 13 and the second power device 23 in the direction parallel to the aforementioned side allows for increasing the size of the semiconductor module 100 in the direction where the respective lead frames are aligned (the horizontal direction in FIGS. 2 and 3) while reducing the size of the semiconductor module 100 in the direction where the respective lead frames extend (the vertical direction in FIGS. 2 and 3). It is preferable that a certain distance is provided between the lead frames. Employing such an arrangement allows for meeting a requirement of securing a certain distance between the lead frames while generally downsizing the semiconductor module 100.

Second Embodiment

Next, a second embodiment according to the invention will be described.

Figure 7:
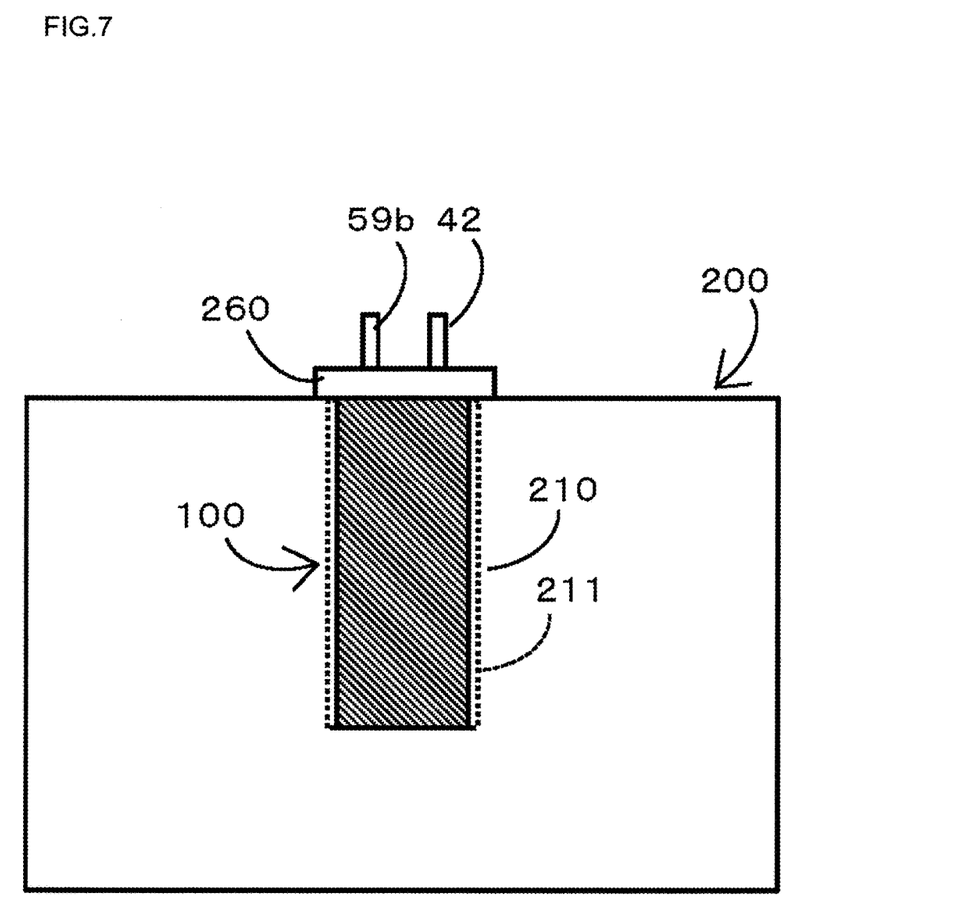
FIG. 7 illustrates a side cross-sectional view of an electronic device according to a second embodiment of the invention.

As illustrated in FIG. 7, the second embodiment relates to an electronic device having the semiconductor module 100 as described in the first embodiment and a heat sink 200 provided with a recessed part 210 for receiving the semiconductor module 100. The size of the recessed part 210 is fabricated to match the size of the semiconductor module 100. Therefore, inserting the semiconductor module 100 into the recessed part 210 allows for fixing the semiconductor module 100 to the heat sink 200.

Other configurations of the second embodiment are substantially the same as those of the first embodiment. In the second embodiment, the same part as the first embodiment is denoted with the same sign and detailed description thereon is omitted.

A lubricant such as the one including silicone grease may be applied to the recessed part 210 of the heat sink 200. Applying such a lubricant allows for easily inserting the semiconductor module 100 into the recessed part 210 of the heat sink 200. Moreover, applying a lubricant can enhance adherence of the second radiation plate 24 and the first radiation plate 14 to the inner surface of the recessed part 210, thereby enhancing heat conductivity from the semiconductor module 100 to the heat sink 200. Therefore, the heat radiation performance can be further improved.

Incidentally, a plurality of grooves 211 may be formed on the inner surface of the recessed part 210 of the heat sink 200 along an inserting direction of the semiconductor module 100 (the vertical direction in FIG. 7). This is because even when inserting the semiconductor module 100 after placing a lubricant in the recessed part 210, forming such grooves 211 helps the lubricant to move upward along the inserting direction of the semiconductor module 100 due to capillary phenomenon.

A sealing part 260 may be provided for covering the semiconductor module 100 inserted in the recessed part 210 of the heat sink 200. This sealing part 260 may be a lid member or, for example, may be formed by partly thermal-spraying a ceramic for sealing. In this manner, sealing, with the sealing part 260, the semiconductor module 100 inserted to the recessed part 210 of the heat sink 200 allows for completely covering the semiconductor module 100. Therefore, even when the semiconductor module 100 generates heat, the heat can be prevented from being transferred to the exterior of the heat sink 200 and the sealing part 260.

Variations

Next, variations according to the invention will be described.

Although the first embodiment employs the arrangement where two power devices of the first power device 13 and the second power device 23 are used, any number of power devices may be used and thus three or more power devices may be used. One example may be using four power devices or using six power devices.

Figure 9:
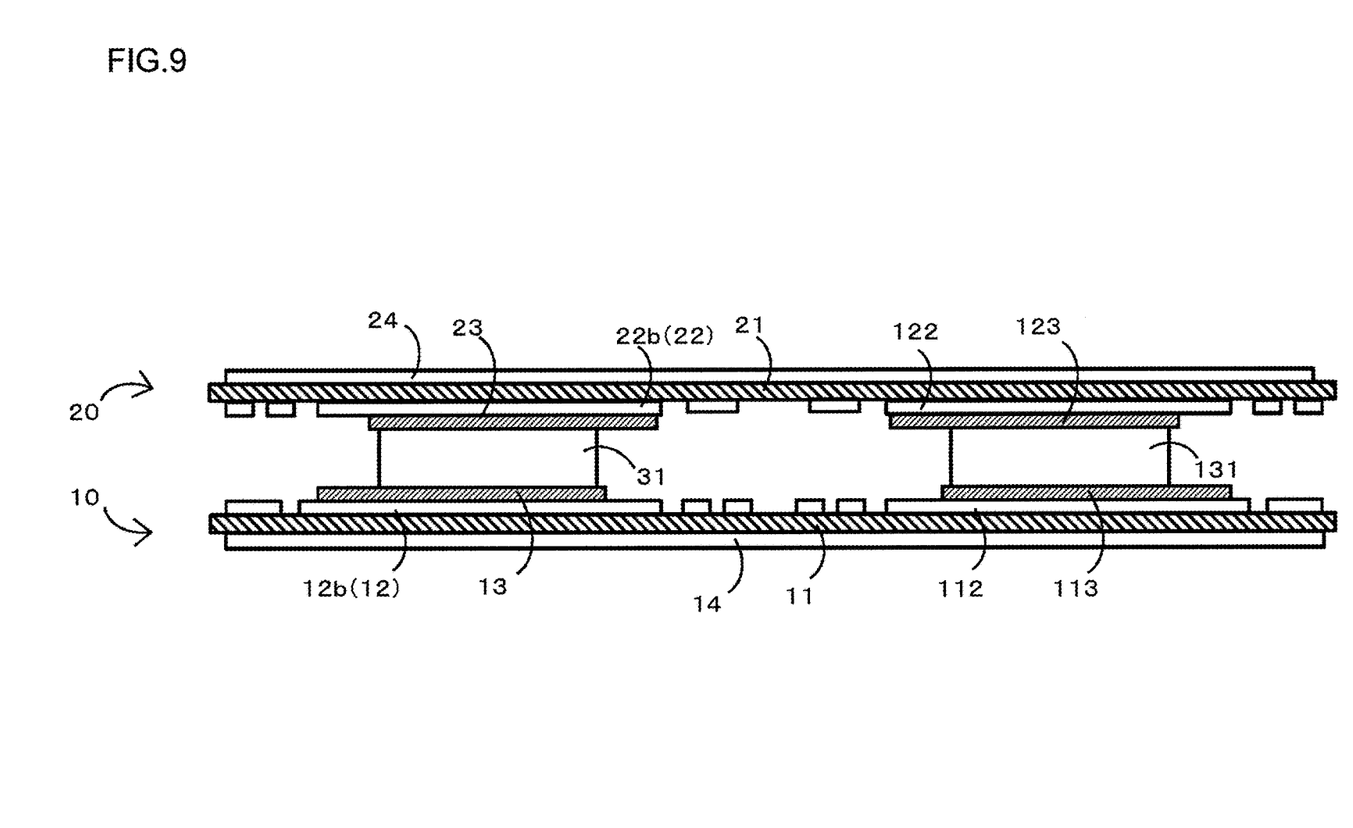
FIG. 9 illustrates a rear cross-sectional view of a semiconductor module according to a variation of the invention.

When using four power devices, as illustrated in FIG. 9, a third power device 113 may be provided to a first insulating substrate 11 via a third conductor layer 112 and a fourth power device 123 may be provided to a second insulating substrate 21 via a fourth conductor layer 122. As illustrated in FIG. 9, the third power device 113 and the fourth power device 123 may be connected via a conductor column 131. Note that FIG. 9 is a view seen from the rear side with lead frames, connection parts, etc. being omitted.

Figure 10:
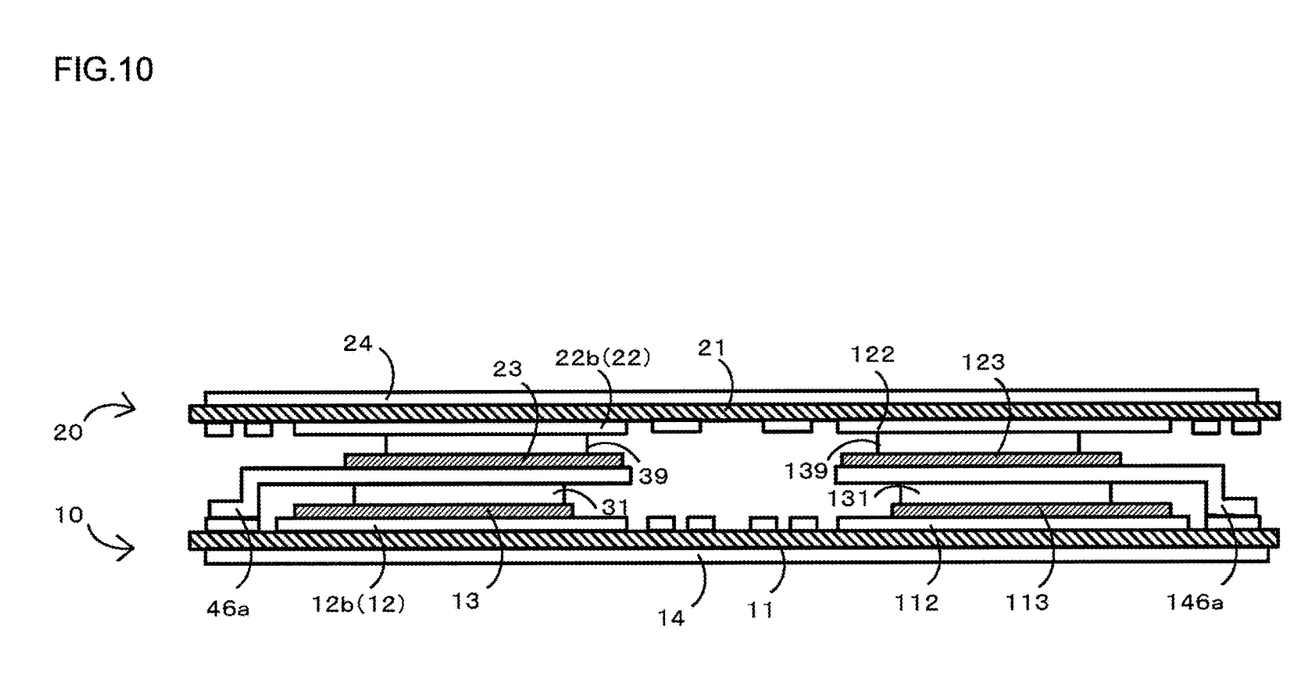
FIG. 10 illustrates a rear cross-sectional view of a semiconductor module according to another variation of the invention.

Alternatively, such an arrangement as in FIG. 10 may be employed. In the arrangement in FIG. 10, a second power device 23 is provided to a first power device 13 via a conductor column 31 and a connecting body 46a and a fourth power device 123 is provided to a third power device 113 via a conductor column 131 and a connecting body 146a. In the arrangement in FIG. 10, a conductor column 39 is provided between the second power device 23 and the second conductor layer part 22b and a conductor column 139 is provided between the fourth power device 123 and a fourth conductor layer 122. The connecting body 46a extends in the horizontal direction and is provided in such a manner as to entirely cover the conductor column 31 when seen from above. The second power device 23 is provided on a part of the top surface of the connecting body 46a. Similarly, the connecting body 146a extends in the horizontal direction and is provided in such a manner as to entirely cover the conductor column 131 when seen from above. The second power device 123 is provided on a part of the top surface of the connecting body 146a. The conductor columns 31 and 131 do not need to be in a complete column shape and may be provided with a notch or a cavity.

Figure 11:
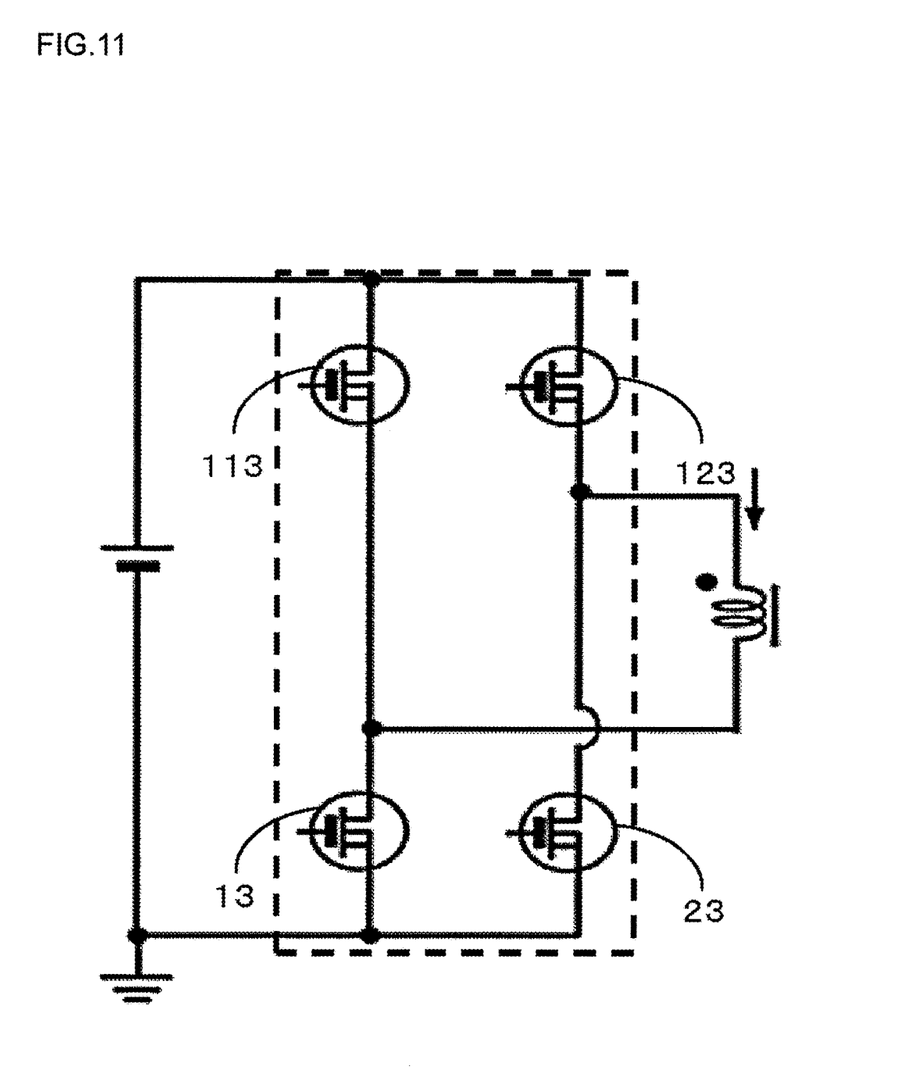
FIG. 11 illustrates a circuit diagram where four devices are used in a variation of the invention.

A circuit diagram when four devices are used as illustrated in FIGS. 9 and 10 may be, for example, as illustrated in FIG. 11. A part encircled by a dotted line in FIG. 11 corresponds to the semiconductor module according to the embodiment.

Figure 12:
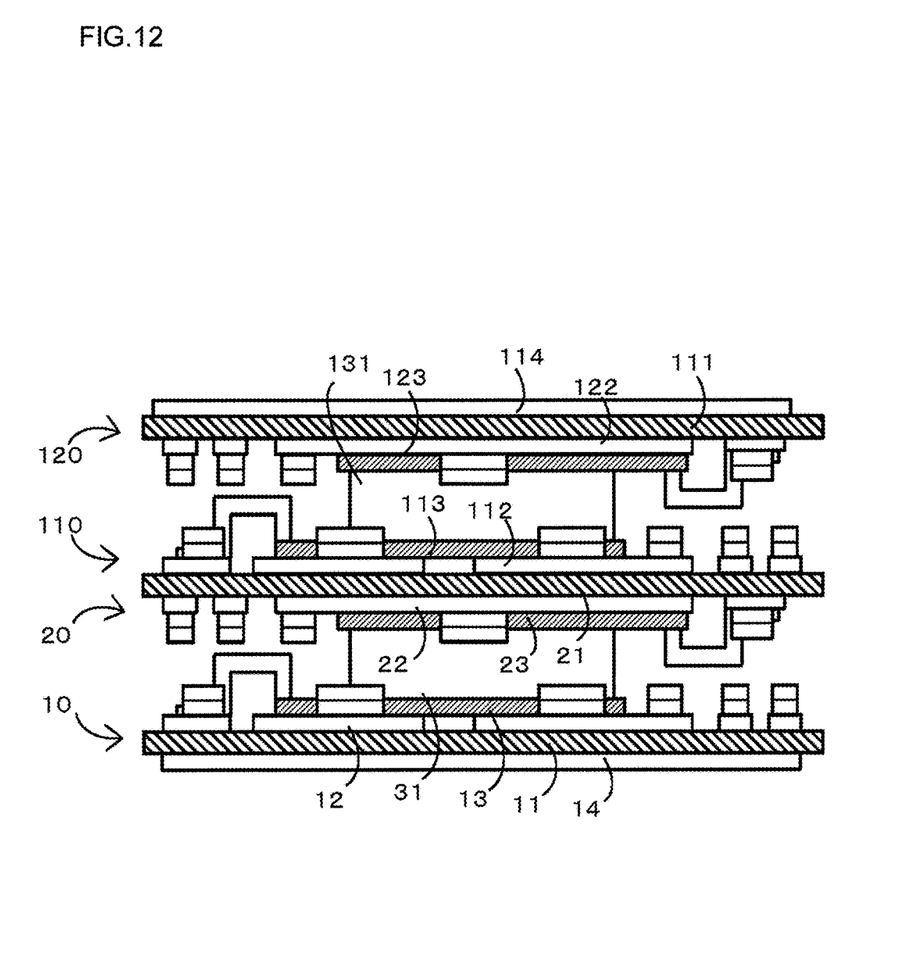
FIG. 12 illustrates a front cross-sectional view of a semiconductor module according to still another variation of the invention.

Alternatively, three or more devices may be laminated. One example may be laminating four devices. In this case, as illustrated in FIG. 12, a first power device 13 and a second power device 23 may be shifted with an angular difference of 180 degrees (shifted in the horizontal direction in FIG. 12) and a third power device 113 and a fourth power device 123 may be shifted with an angular difference of 180 degrees (shifted in the horizontal direction in FIG. 12) while the first power device 13 and the third power device 113 may be aligned without being shifted from each other, and the second power device 23 and the fourth power device 123 may not be provided. In the arrangement in FIG. 12, a fourth conductor layer 122 is provided on the lower surface of a third insulating substrate 111 and a third conductor layer 112 is provided on the top surface of a second insulating substrate 21. An arrangement in the horizontal direction in a third member 110 including the third conductor layer 112 and the third power device 113 is completely the same as or similar to that in a first member 10. Also, an arrangement in the horizontal direction in a fourth member 120 including the fourth conductor layer 122 and the fourth power device 123 is completely the same as or similar to that in a second member 20.

Alternatively, unlike the arrangement as in FIG. 12, members included in the third member 110 (the third conductor layer 112, third power device 113, etc.) and members included in the first member 10 (the first conductor layer 12, first power device 13, etc.) may be arranged in the horizontal direction with an angular difference of 90 degrees in a clockwise direction when seen from the above. Also, members included in the fourth member 120 (the fourth conductor layer 122, fourth power device 123, etc.) and members included in the first member 10 (the first conductor layer 12, first power device 13, etc.) may be arranged in the horizontal direction with an angular difference of 270 degrees in a clockwise direction when seen from the above.

Alternatively, members included in the third member 110 (the third conductor layer 112, third power device 113, etc.)

and members included in the first member 10 (the first conductor layer 12, first power device 13, etc.) may be arranged in the horizontal direction with an angular difference of 270 degrees in a clockwise direction when seen from the above. Also, members included in the fourth member 120 (the fourth conductor layer 122, fourth power device 123, etc.) and members included in the first member 10 (the first conductor layer 12, first power device 13, etc.) may be arranged in the horizontal direction with an angular difference of 90 degrees in a clockwise direction when seen from the above.

When four devices are laminated in such a manner, a circuit diagram may be, for example, as illustrated in FIG. 11.

Lastly, descriptions on the aforementioned respective embodiments and variations as well as disclosed drawings are merely examples for describing the invention described in CLAIMS. The descriptions on the aforementioned embodiments or disclosed drawings should not be construed to limit the invention described in CLAIMS.

REFERENCE SIGNS LIST 10 first member
11 first insulating substrate
12 first conductor layer
13 first power device
20 second member
21 second insulating substrate
22 second conductor layer
23 second power device
31 conductor column
46 first connection part
47 column connection part
56 second connection part
80 sealing resin
100 Semiconductor module
200 heat sink
210 recessed part
260 sealing part

What is claimed is:

1. A semiconductor module comprising:
a first member having a first insulating substrate, a first conductor layer provided on a mounting surface of the first insulating substrate, a first power device provided on the first conductor layer and a first connection part connected to the first power device;
a second member having a second insulating substrate, a second conductor layer provided on a mounting surface of the second insulating substrate, a second power device provided on the second conductor layer and a second connection part connected to the second power device;
a conductor column extending from the first power device to the second power device between the first power device and the second power device, wherein a length of the conductor column in a direction from the first power device to the second power device between the first power device and the second power device is longer than a length of the conductor column in a direction vertical to the direction from the first power device to the second power device; and
a sealing resin covering the first conductor layer, the first power device, the second conductor layer, the second power device and the conductor column;
wherein the first power device and the second power device are disposed opposite to each other and connected to each other via the conductor column,
wherein positions of the first power device and the second power device are shifted,
wherein the second conductor layer is provided in a region that is distinct from the region of the first connection part, and
wherein the first conductor layer is provided in a region that is distinct from the region of the second connection part.

2. The semiconductor module according to claim 1,
wherein the first power device has a first high heating surface and a first low heating surface which is the opposite surface of the first high heating surface and has a smaller calorific value than that of the first high heating surface,
wherein the second power device has a second high heating surface and a second low heating surface which is the opposite surface of the second high heating surface and has a smaller calorific value than that of the second high heating surface, and
wherein the first high heating surface and the second high heating surface are disposed opposite to each other and connected via the conductor column.

3. The semiconductor module according to claim 2,
wherein the first power device and the second power device are switching devices, and
wherein a side surface of the conductor column is provided with a column connection part connected to a source electrode.

4. The semiconductor module according to claim 1,
wherein the first power device and the second power device are switching devices, and
wherein the first connection part and the second connection part are connected to control electrodes.

5. The semiconductor module according to claim 1,
wherein the first power device is shifted, from the conductor column, and the second power device is shifted, from the conductor column, such that at least one side of the first power device does not completely overlap with at least one side of the second power device.

6. The semiconductor module according to claim 1, further comprising a plurality of lead frames,
wherein each of the lead frames protrudes to the outside from one side of the sealing resin, and
wherein the first power device and the second power device are shifted in a direction parallel to the side.

7. An electronic device comprising:
the semiconductor module according to claim 1, and
a heat sink provided with a recessed part for receiving the semiconductor module.

8. The electronic device according to claim 7,
wherein a lubricant is applied between the recessed part of the heat sink and the semiconductor module.

9. The electronic device according to claim 7, further comprising a sealing part covering the semiconductor module inserted in the recessed part of the heat sink.

* * * * *